United States Patent
Li et al.

(10) Patent No.: US 7,817,463 B2
(45) Date of Patent: Oct. 19, 2010

(54) SYSTEM AND METHOD TO FABRICATE MAGNETIC RANDOM ACCESS MEMORY

(75) Inventors: Xia Li, San Diego, CA (US); Xiaochun Zhu, San Diego, CA (US); Seung H. Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 180 days.

(21) Appl. No.: 12/164,272

(22) Filed: Jun. 30, 2008

(65) Prior Publication Data

US 2009/0323410 A1 Dec. 31, 2009

(51) Int. Cl.
 G11C 7/00 (2006.01)
(52) U.S. Cl. ...................... 365/158; 365/173
(58) Field of Classification Search .............. 365/158, 365/173
See application file for complete search history.

(56) References Cited

U.S. PATENT DOCUMENTS

| | | | | |
|---|---|---|---|---|
| 3,626,124 | A * | 12/1971 | Denes, Peter A. | ............ 218/150 |
| 5,630,916 | A | 5/1997 | Gerrish et al. | |
| 6,177,207 | B1 * | 1/2001 | Koike | ....................... 428/811.5 |
| 6,571,729 | B2 | 6/2003 | Sasaki et al. | |
| 6,616,816 | B2 | 9/2003 | Sakai | |
| 6,641,703 | B2 | 11/2003 | Nomura et al. | |
| 6,765,819 | B1 * | 7/2004 | Bhattacharyya et al. | ..... 365/158 |
| 7,239,545 | B2 | 7/2007 | Hosotani | |
| 2003/0170471 | A1 * | 9/2003 | Seto et al. | ..................... 428/469 |
| 2004/0257719 | A1 | 12/2004 | Ohba et al. | |
| 2006/0033136 | A1 | 2/2006 | Liu et al. | |
| 2007/0224707 | A1 | 9/2007 | Hosotani | |
| 2007/0297219 | A1 | 12/2007 | Dittrich et al. | |
| 2007/0297222 | A1 | 12/2007 | Leushner | |

FOREIGN PATENT DOCUMENTS

| | | |
|---|---|---|
| WO | 0014768 | 3/2000 |
| WO | 0033332 | 6/2000 |
| WO | 2009120487 | 10/2009 |

OTHER PUBLICATIONS

Luna, Zehe, and Zelaya-Angel, "Chemical CdS Thin-Film Deposition Influenced by External Electric and Magnetic Fields," Cryst. Res. Technol. 34(1999) 8, 949-958.
International Search Report-PCT/US2009/048248, International Search Authority-European Patent Office Oct. 10, 2009.
Written Opinion-PCT/US2009/048248, International Search Authority-European Patent Office Oct. 10, 2009.

* cited by examiner

*Primary Examiner*—Michael T Tran
(74) *Attorney, Agent, or Firm*—Sam Talpalatsky; Nicholas J. Pauley; Peter M. Kamarchik

(57) ABSTRACT

A system and method to fabricate magnetic random access memory is disclosed. In a particular embodiment, a method of aligning a magnetic film during deposition is disclosed. The method includes applying a first magnetic field along a first direction in a region in which a substrate resides during a deposition of a first magnetic material onto the substrate. The method further includes applying a second magnetic field along a second direction in the region during the deposition of the first magnetic material onto the substrate.

38 Claims, 7 Drawing Sheets

SYSTEM AND METHOD TO FABRICATE MAGNETIC RANDOM ACCESS MEMORY

I. FIELD

The present disclosure is generally related to fabricating magnetic random access memory.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet Protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Reducing power consumption has led to smaller circuitry feature sizes and operating voltages within such portable devices. Reduction of feature size and operating voltages, while reducing power consumption, also increases sensitivity to noise and to manufacturing process variations.

Memory is typically included in wireless devices, and power consumption may be reduced through reduction of memory power requirements. Magnetic Random Access Memory (MRAM) may consume less power than other types of memory, and may be desirable for use in wireless devices. Fabrication techniques that increase effectiveness of MRAM devices by decreasing power consumption or increasing reliability with reduced feature size are therefore desirable.

III. SUMMARY

In a particular embodiment, a method of aligning a magnetic film is disclosed. The method includes applying a first magnetic field during a deposition of a first magnetic material onto a substrate and applying a second magnetic field along a second direction in the region concurrently during the deposition onto the substrate.

In another particular embodiment, an apparatus is disclosed. The apparatus includes a deposition chamber configured to deposit a magnetic material onto a substrate. The deposition chamber includes a deposition region. The apparatus also includes means for applying a first magnetic field within the deposition region, the first magnetic field oriented substantially along a first direction. The apparatus further includes means for applying a second magnetic field within the deposition region, the second magnetic field oriented substantially along a second direction.

In another particular embodiment, the apparatus includes a housing defining an enclosure configured to enclose a substrate including a first substrate portion having a first easy axis and a second substrate portion having a second easy axis. The substrate is to receive a magnetic material via deposition while the substrate is in the enclosure. The apparatus further includes a first magnetic field generator configured to generate a first magnetic field in the enclosure. The first magnetic field has a first magnetic field direction. The apparatus also includes a second magnetic field generator configured to generate a second magnetic field in the enclosure. The second magnetic field has a second magnetic field direction. When the first magnetic field direction substantially coincides with the first easy axis, a first portion of the deposited magnetic material residing on the first substrate portion has a first magnetic orientation that is at least partially aligned with the first easy axis. When the second magnetic field substantially coincides with the second easy axis, a second portion of the deposited magnetic material residing on the second substrate portion has a second magnetic orientation that is at least partially aligned with the second easy axis.

In another particular embodiment, a magnetic random access memory (MRAM) is disclosed. The MRAM includes a substrate including a first substrate portion having a first easy axis and a second substrate portion having a second easy axis. The MRAM also has a film that includes magnetic material deposited on the substrate. The film includes a first film portion and a second film portion. The first film portion is coupled to the first substrate portion, and the first film portion includes a first magnetic material portion that is aligned substantially along the first easy axis. The film also includes a second film portion coupled to the second substrate portion. The second film portion includes a second magnetic material portion that is substantially aligned with the second easy axis. During deposition of the film, the substrate is subjected to a first magnetic field that is oriented substantially along the first easy axis while the substrate is also subjected to a second magnetic field that is oriented substantially along the second easy axis.

A Tunnel Magnetoresistant Ratio (TMR) is a measure of a difference in resistances of a Magnetic Tunnel Junction (MTJ) between a "0" state and a "1" state stored in the MTJ within an MRAM. The larger the TMR, the more definitive the transition between states and the less current that may be needed to write data to an MTJ of an MRAM. One particular advantage provided by at least one of the disclosed embodiments is that an MRAM that incorporates one or more MTJs fabricated according to one or more of the disclosed embodiments may exhibit lower power consumption due to an increased TMR of some or all of the MTJs within the MRAM.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. Detailed Description

Figure 1:
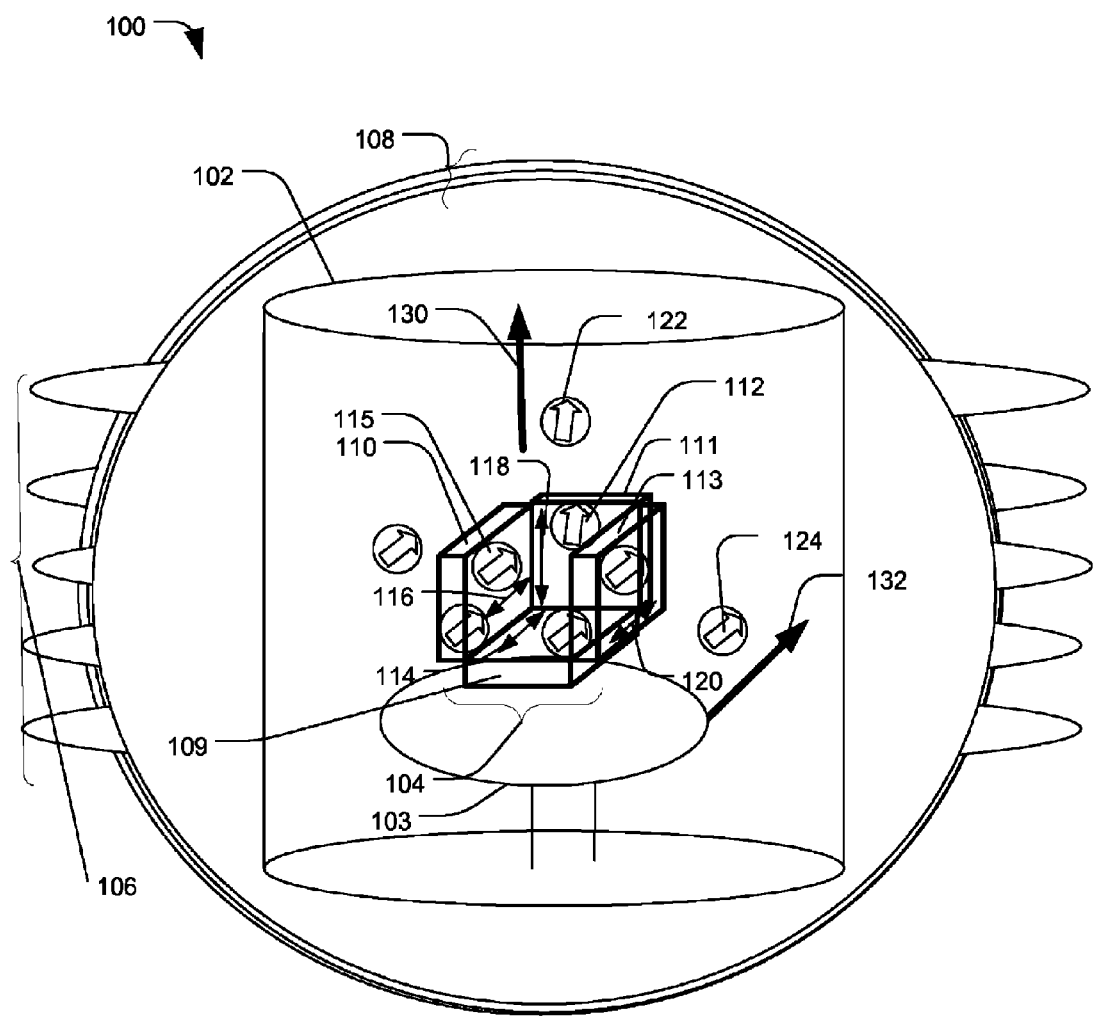
FIG. 1 is a diagram of a particular illustrative embodiment of an apparatus to deposit a magnetic film.

Referring to FIG. 1A, a diagram of a particular illustrative embodiment of an apparatus to deposit a magnetic film is depicted and generally designated 100. The apparatus includes a deposition chamber 102 defining an enclosure in which deposition of a magnetic material may occur. The deposition chamber 102 is encircled by a first coil 106 having a first orientation and made of an electrically conducting material. The deposition chamber 102 is also encircled by a second coil 108 having a second orientation and made of the same electrically conducting material or another electrically conducting material. An object 104 on which a first magnetic material may be deposited may be placed within the enclosure defined by a trench in a substrate. The substrate may be supported within the deposition chamber 102 by a support chuck plate 103. In a particular illustrative embodiment, the object 104 includes a first wall 109, a second wall 110, a third wall 111, and a fourth wall 113. In a particular illustrative embodiment, prior to placement in the deposition chamber 102, the object 104 has been fabricated with each wall formed by the trench. Each wall of the object 104 has an easy axis associated with the corresponding pinned magnetic layer and each easy axis may have an orientation associated with a corresponding wall geometry. In an illustrative example, a wall that is a rectangle may have an easy axis that is oriented along a major axis of the rectangle. For example, the first wall 109 has an easy axis 114, the second wall 110 has an easy axis 116, the third wall 111 has an easy axis 118, and the fourth wall 113 has an easy axis 120.

The first coil 106 may produce a first magnetic field 130. The second coil 108 may produce a second magnetic field 132. In a particular illustrative embodiment, the first magnetic field 130 is approximately perpendicular to the second magnetic field 132. In another particular illustrative embodiment, the first magnetic field 130 may be at an oblique angle with respect to the second magnetic field 132.

The first coil 106 may produce the first magnetic field 130 when a first electrical current (not shown) passes through the coil 106, and the second coil 108 may produce the second magnetic field 132 when a second electrical current (not shown) passes through the second coil 108. In another particular illustrative embodiment, the first magnetic field 130 or the second magnetic field 132 may be provided by permanent magnets, which may be arranged in a ring or other structure surrounding the deposition chamber 102. In yet another particular illustrative embodiment, the first magnetic field 130 or the second magnetic field 132 may be provided through use of an alternative type of magnetic field generating apparatus.

In a particular illustrative embodiment, each magnetic field may be localized spatially within the deposition chamber 102.

In operation, the deposition chamber 102 may contain magnetic particles in a gaseous state to be deposited on the walls of the object 104. The magnetic particles may include an illustrative magnetic particle 122 that may have a first magnetic orientation that is substantially aligned with the first magnetic field 130, and a second illustrative magnetic particle 124 that may have a second magnetic orientation that is substantially aligned with the second magnetic field 132.

In a particular illustrative embodiment, prior to deposition of magnetic particles, the object 104 may be positioned within the deposition chamber 102 with the easy axis 118 substantially aligned to the first magnetic field 130 and where the third wall 111 is situated in a first region in which the first magnetic field 130 is present. The object 104 may also be positioned with the easy axes 114, 116 and 120 substantially aligned along the second magnetic field 132 and the first wall 109, the second wall 110 and the fourth wall 114 situated within a second region in which the second magnetic field 132 is present. Alternatively, the first magnetic field 130 may be oriented approximately parallel to the easy axis 118. Further, the second magnetic field 132 may be oriented approximately parallel to the easy axes 114, 116, and 120.

The first magnetic field 130 and the second magnetic field 132 may be applied at approximately the same time, or the first magnetic field 130 and the second magnetic field 132 may be applied during a common time interval. As the magnetic particles settle on surfaces of the object 104, each magnetic particle may be aligned along the corresponding easy axis of the wall upon which it settles due to the presence of the first magnetic field 130 or the second magnetic field 132. Prior to magnetic material deposition, paramagnetic conduct materials are deposited. The paramagnetic conduct materials lead to magnetic field aligning with layer direction. This enhances same magnetic field alignment particles binding with easy axis of a corresponding wall. For example, a first magnetic particle 112 that is subject to the first magnetic field 130 may be aligned along the easy axis 118 as it adheres to the third wall 111. A second magnetic particle 115 that is subject to the second magnetic field 132 may be aligned along the easy axis 116 as it adheres to the second wall 110. Magnetic alignment of deposited magnetic particles substantially along an easy axis of a wall may result in an increased Tunnel Magnetoresistant Ratio (TMR) of the fabricated MTJ. When incorporated into an MRAM, MTJs fabricated using the deposition method described herein (three dimension) may result in lower power consumption and higher MTJ density of the resulting MRAM in comparison with MRAMs that are made with MTJs fabricated by other methods (e.g. one dimension).

In another particular illustrative embodiment, the first magnetic field 130 and the second magnetic field 132 may have a substantially uniform field strength throughout a portion of the deposition chamber. In this case, magnetic particles being deposited may tend to align along a resultant magnetic field that is a vector sum of the first magnetic field 130 and the second magnetic field 132. The magnetic particles deposited onto the walls of the object 104 may be aligned along the vector sum of the first magnetic field 130 and the second magnetic field 132, and each deposited magnetic particle may be at least partially aligned with the corresponding easy axis of the wall on which the magnetic particle is deposited.

Figure 2:
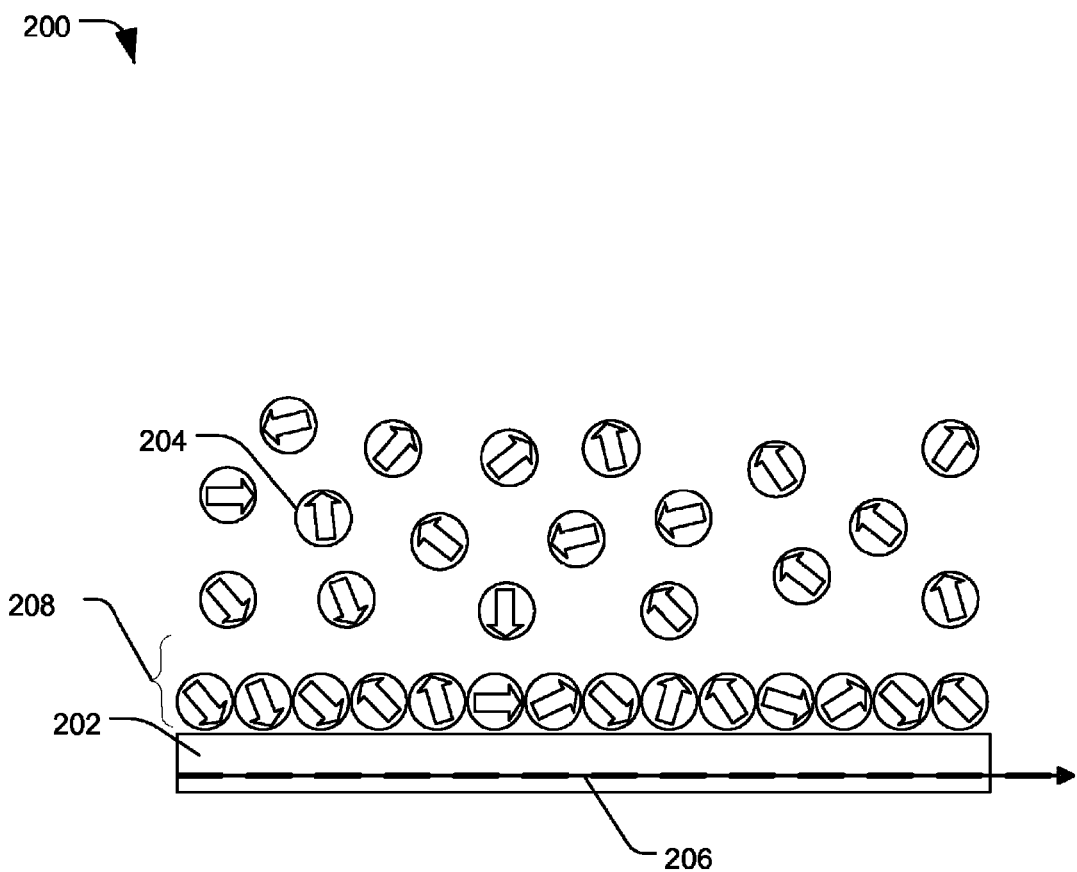
FIG. 2 is a diagram of a particular illustrative embodiment depicting deposition of a magnetic film that forms a portion of a magnetic random access memory.

Referring to FIG. 2, a diagram of a particular illustrative embodiment depicts deposition of a magnetic film, including a first magnetic material, to form a portion of a magnetic random access memory generally designated 200. A substrate 202 includes a second magnetic material that has a substantially fixed orientation within the substrate 202. The second magnetic material within the substrate 202 may be referred to as "pinned" in orientation (also "pinned layer" herein).

During deposition, exposed surfaces of the substrate 202 become coated with magnetic particles. The deposition chamber may deposit magnetic materials through physical vapor deposition, plasma enhanced physical vapor deposition, or via another means of material deposition. As magnetic particles are deposited on the substrate 202, the magnetic particles form a magnetic film 208 that may include many molecular thicknesses of magnetic particles. The magnetic particles that are deposited may have random magnetic orientations. An arrow 206 represents an easy axis of the substrate, which is a preferred direction of orientation associated with the substrate shape and a pinned magnetic layer within the substrate 202. As a result of the random orientations of the deposited magnetic particles, there is typically no magnetic alignment of the deposited magnetic particles along the easy axis 206 of the substrate 202.

Figure 3:
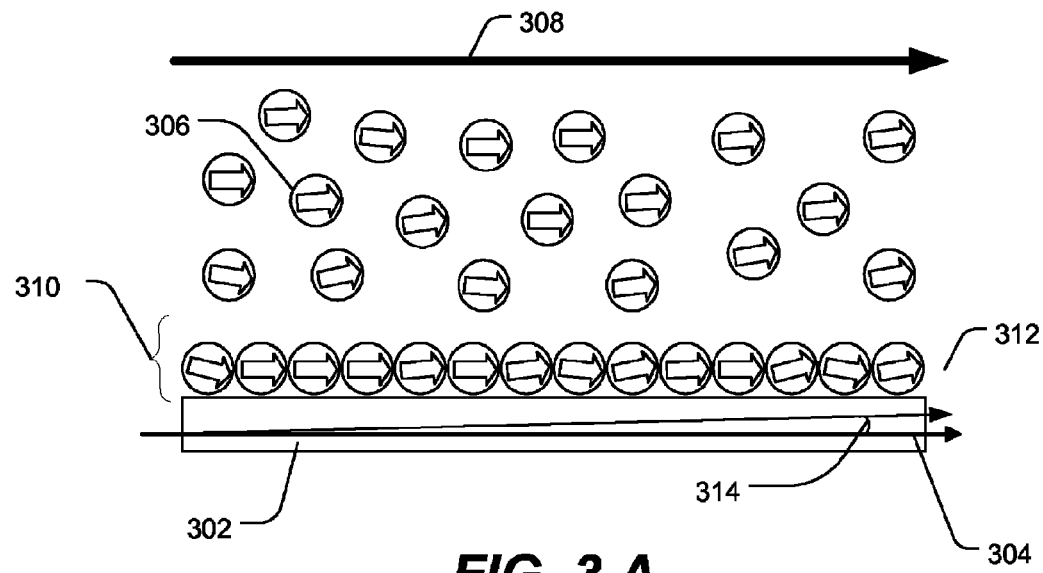
FIG. 3A is a diagram of another particular illustrative embodiment depicting deposition of a magnetic film that forms a portion of a magnetic random access memory.
FIG. 3B is a diagram of another particular illustrative embodiment depicting deposition of a magnetic film that forms a portion of a magnetic random access memory.
Figure 3:
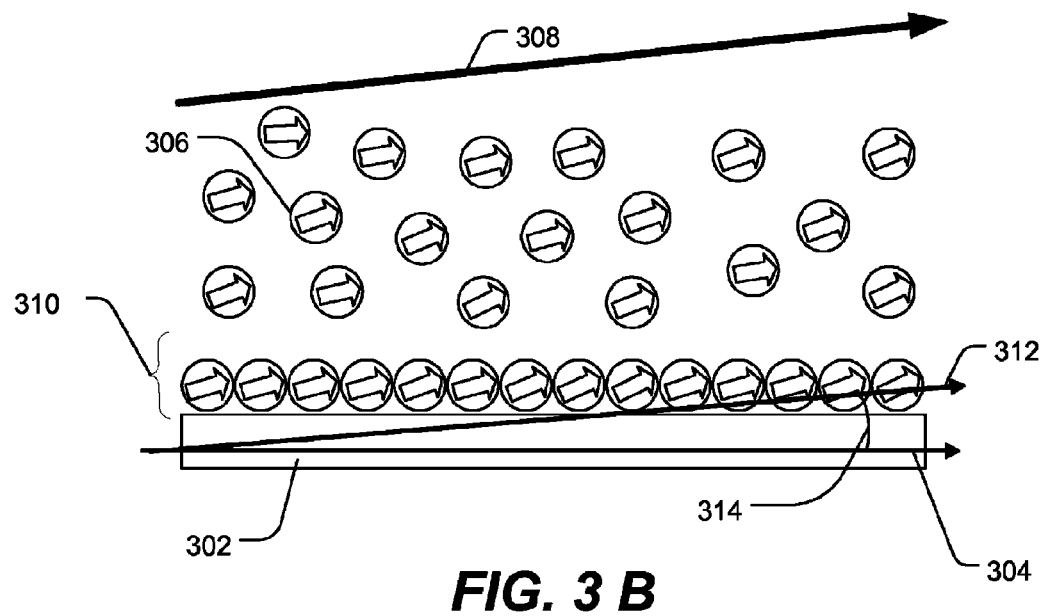

Referring to FIG. 3A, a diagram of another particular illustrative embodiment depicting deposition of a magnetic film that forms a portion of a magnetic random access memory is depicted. A substrate 302 has been placed into a deposition chamber to receive magnetic particles that form a magnetic film 310 on the substrate 302. The deposition chamber (not shown) may deposit the magnetic particles via physical vapor deposition, plasma enhanced physical vapor deposition, or via another means. A magnetic field 308, which is typically of low intensity, e.g., less than 100 Oersted, may be applied during deposition to the space within the deposition chamber. Magnetic particles, such as magnetic particle 306, may become aligned along a direction of an applied magnetic field 308 during deposition while in the presence of the magnetic field 308. The substrate 302 may have an easy axis 304. Prior to deposition, the substrate 302 may be positioned so that the easy axis 304 is aligned with the magnetic field 308. During deposition the magnetic particles may align themselves substantially along a direction of the magnetic field 308, which is parallel to the easy axis 304. The magnetic particles deposited on the substrate 302 form the magnetic film 310, which may have an average magnetic orientation 312 of the magnetic particles within the magnetic film 310. An angle of deviation 314 represents a deviation in direction of the average magnetic orientation 312 from the easy axis 304. As a result of applying the low intensity magnetic field 308 during deposition, the angle of deviation 314 may be small, indicative of substantial alignment of the average magnetic orientation 312 and the easy axis 304. Thus, as a result of the low intensity magnetic field 308 during deposition, the magnetic film 310 is closely aligned with the easy axis 304 of the substrate 302. Alignment may result in an increased Tunnel Magnetoresistant Ratio (TMR) of a fabricated MTJ. When incorporated into an MRAM, MTJs fabricated using the deposition method described herein may result in lower power consumption of the resulting MRAM in comparison with MRAMs that are made with MTJs fabricated by other methods.

Referring to FIG. 3B, a diagram of another particular illustrative embodiment depicting deposition of a magnetic film that forms a portion of a magnetic random access memory is depicted. Prior to deposition, the substrate 302 may be positioned with the easy axis 304 along a component of the magnetic field 308. As a result of the presence of the magnetic field 308 during deposition, the magnetic particles deposited may be aligned parallel to the magnetic field 308. By applying the low intensity magnetic field 308 during deposition, the angle of deviation 314 between an average magnetic orientation 312 of the magnetic film 310 and the easy axis 304 may be reduced from the angle of deviation that may occur without the presence of the magnetic field 308 during deposition. Thus, as a result of the low intensity magnetic field 308 applied during deposition, the magnetic orientation 312 is at least partially aligned with the easy axis 304 of the substrate 302.

In a particular illustrative embodiment, the magnetic field 308 may have a magnetic field strength that is less than a few hundred, e.g. less than 100 Oersted. In another particular illustrative embodiment, the magnetic field 308 may have a magnetic field strength that is less than approximately few tens Oersted. In yet another particular illustrative embodiment, the magnetic field 308 may be less than a few hundred, e.g. less than 100 Oersted.

Figure 4:
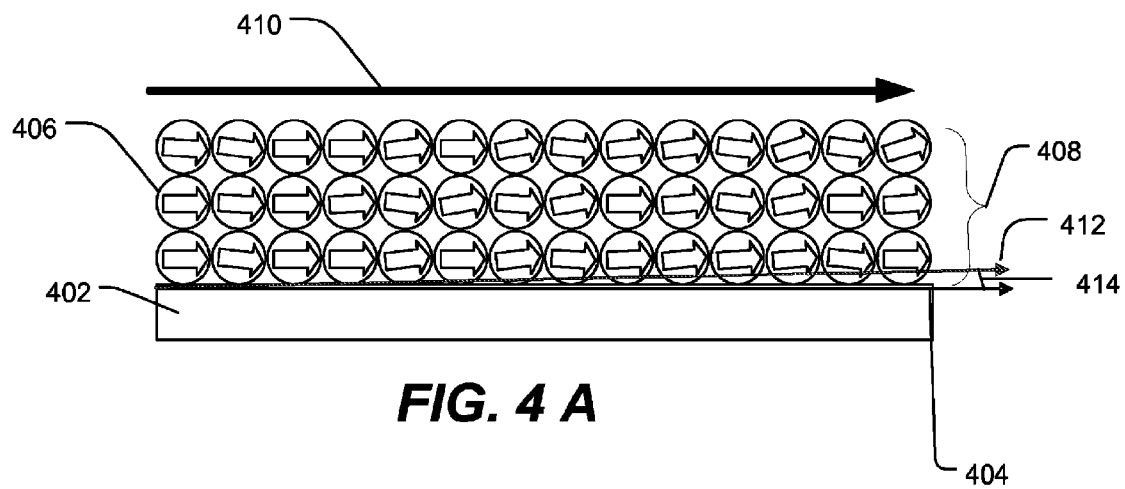
FIG. 4A is a diagram of another particular illustrative embodiment of a magnetic film on a substrate that forms a portion of a magnetic random access memory.
FIG. 4B is a diagram of a particular illustrative embodiment of a portion of a magnetic random access memory.
Figure 4:
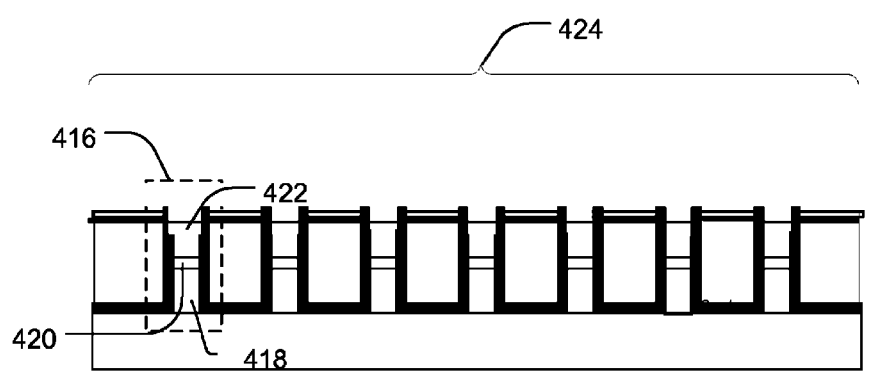

Referring to FIG. 4A, another particular illustrative embodiment is shown of a magnetic film on a substrate that forms a portion of a magnetic random access memory. A substrate 402 having an easy axis 404 has received a layer of magnetic material forming a magnetic film 408 via deposition, such as physical vapor deposition, or via another means. The substrate 402 and the magnetic film 408 are subjected to magnetic annealing, in which the easy axis 404 is positioned along a direction of a strong magnetic field (~10000 Oersted ) 410 and the substrate 402 and magnetic film 408 are elevated in temperature for a pre-determined period of time. As a result of magnetic annealing, the magnetic particles, such as magnetic particle 406 within the magnetic film 408, tend to orient in the direction of the magnetic field 410. As a result, after magnetic annealing, an average magnetic orientation 412 of magnetic particles within the magnetic film 408 is substantially along the easy axis 404, as shown by a very small angle of deviation 414 of the average magnetic field direction of the magnetic particles of magnetic film 408 from the easy axis 404. Thus, magnetic annealing serves to further align magnetic particles within the magnetic film 408 that have been partially aligned during deposition in the presence of a low strength magnetic field.

Referring to FIG. 4B, the substrate and magnetic film of FIG. 4A has been patterned to form a magnetic random access memory (MRAM) 424. The MRAM 424 includes a plurality of magnetic tunnel junctions (MTJs), such as MTJ 416. The MTJ 416 includes a pinned ferromagnetic layer 418, a tunneling barrier 420, and a free ferromagnetic layer 422. The free ferromagnetic layer 422 may include a portion of the film 408 shown in FIG. 4A. The fixed ferromagnetic layer 418 may include a portion of the substrate 402 shown in FIG. 4A. Thus, a substrate 402 that has a magnetic film 408 deposited on it may be patterned into a plurality of MTJs, forming a magnetic random access memory.

Figure 5:
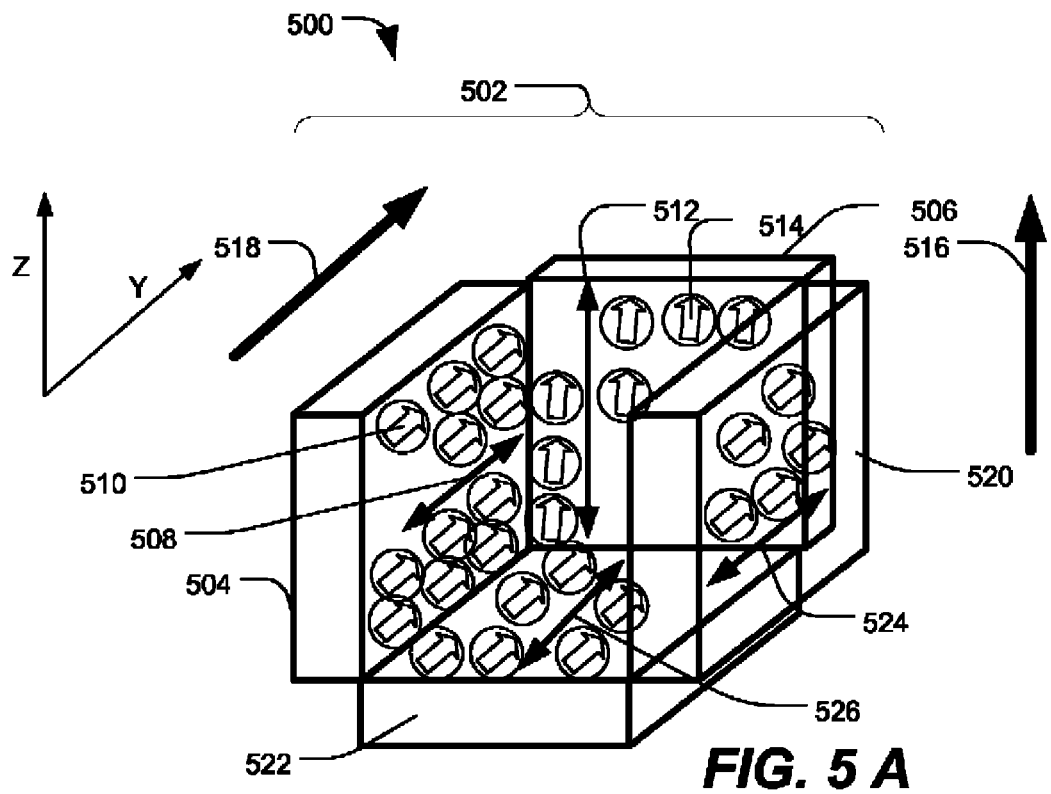
FIG. 5A is a diagram of another particular illustrative embodiment of a portion of a magnetic random access memory.
FIG. 5B is a diagram of another particular illustrative embodiment of a portion of a magnetic random access memory.
Figure 5:
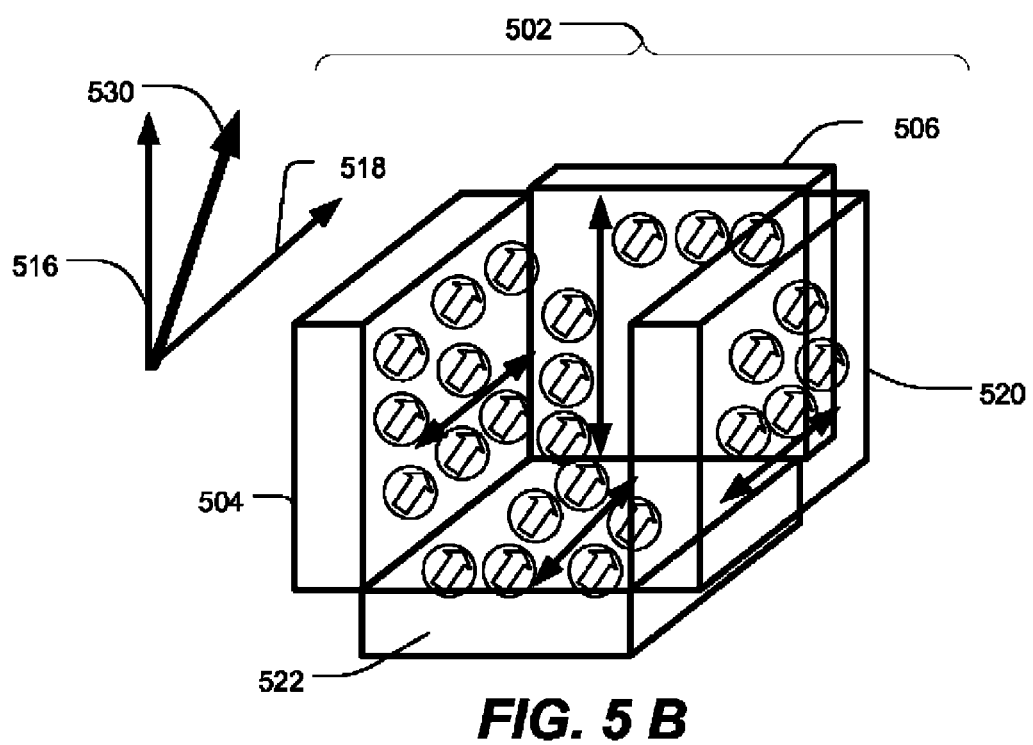

Referring to FIG. 5A, a diagram of another particular illustrative embodiment of a portion of a random access memory is shown and generally designated 500. A magnetic tunnel junction (MTJ) cell 502 includes a plurality of walls, with each wall having a corresponding pinned magnetic layer. A first wall 504 has a first easy axis 508. A second wall 520 has a second easy axis 524. A third wall 506 has a third easy axis 512. A fourth wall 522 has a fourth easy axis 526. During fabrication, the MTJ cell 502 may be subjected to deposition of magnetic material. During deposition, the MTJ cell 502 may be within a deposition chamber in which a first low intensity magnetic field 516 is applied and localized to a region of a deposition chamber (not shown) that includes the third wall 506. A second magnetic low intensity magnetic field 518 with a second direction may be applied and localized to another region of the deposition chamber that includes the first wall 504, the second wall 520, and the fourth wall 522. Prior to deposition, the cell 502 may be oriented so that the third easy axis 512 is approximately parallel to the first magnetic field 516, and the easy axes 508, 524, and 526 are approximately parallel to the second magnetic field 518.

As a result of the presence of the low intensity magnetic fields 516 and 518 during deposition, each magnetic particle that is deposited on the structure 502 tends to align along the easy axis of the wall on which the magnetic particle is deposited. For example, a magnetic particle 510, when deposited, tends to align along the first easy axis 508 corresponding to the first wall 504. A magnetic particle 514 that is deposited on the third wall 506 tends to align along the third easy axis 512. Thus, as a result of the presence of the first magnetic field 516 and the second magnetic field 518, the magnetic particles that are deposited on the walls of the structure 502 forming a magnetic film on each of the walls tend to align along the respective easy axis corresponding to the wall on which the magnetic particle is deposited. As a result, the magnetic film deposited on a wall surface tends to be aligned along the easy axis of the corresponding wall. Thus, due to the presence of the low intensity magnetic field during deposition, a magnetic film deposited on a wall of the device 502 tends to align closely with the corresponding easy axis, which can result in an enhanced tunnel magneto resistant ratio (TMR) of the MTJ.

Referring to FIG. 5B, a diagram of another particular illustrative embodiment of a portion of a magnetic random access memory is shown. During deposition the device 502 may be within the deposition chamber in which the first low intensity magnetic field 516 and the second magnetic low intensity magnetic field 518 are approximately uniformly present throughout a region of the deposition chamber in which the device 502 is placed. Magnetic particles that are deposited on walls 504, 506, 520, and 522 may tend to align along a resultant magnetic field direction 530 that is a vector sum of the first magnetic field 516 and the second magnetic field 518. Each magnetic particle may have a magnetic orientation with a component along an easy axis of the wall on which it has been deposited, and so may be at least partially aligned with the easy axis of the corresponding wall.

Figure 6:
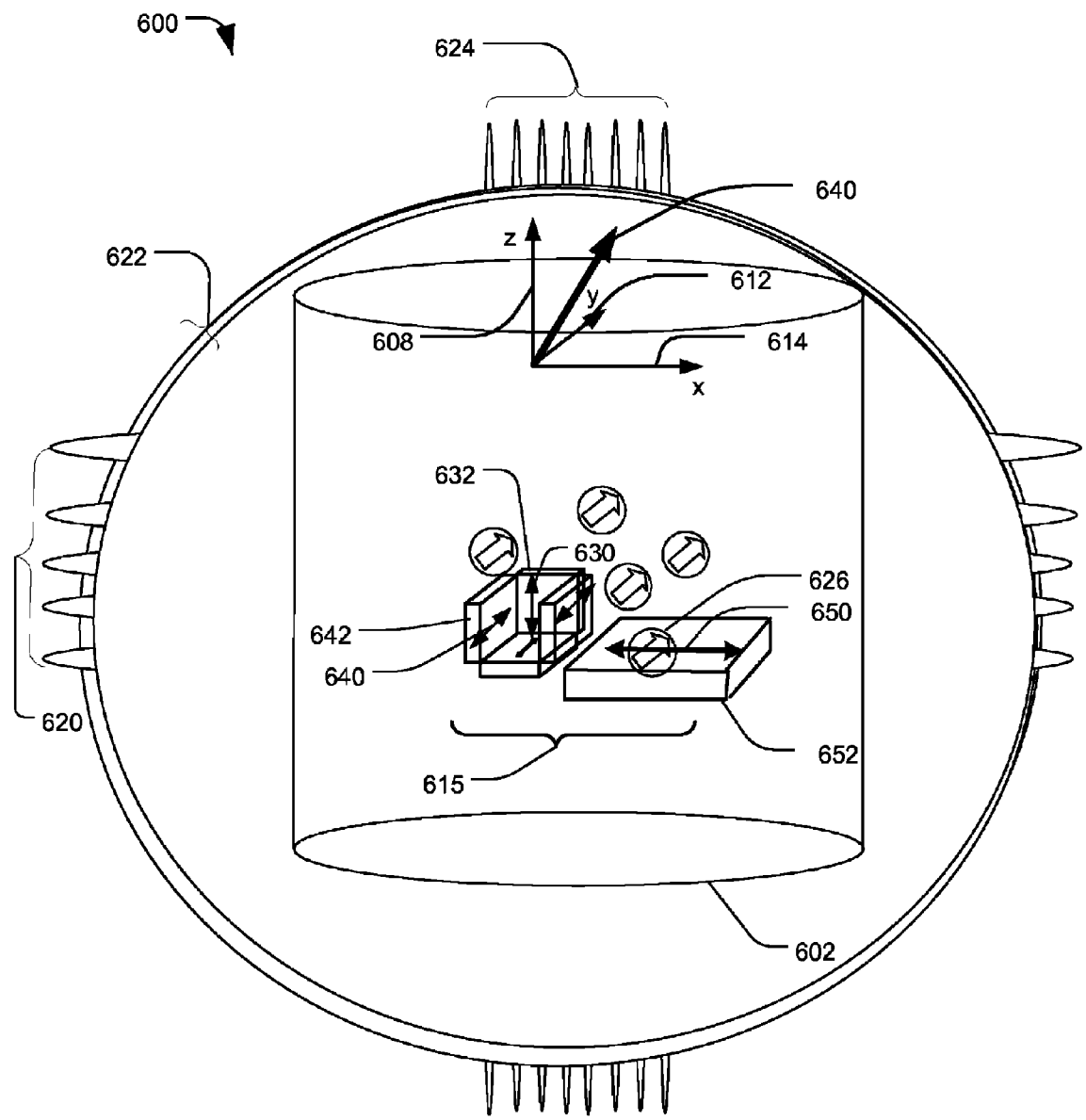
FIG. 6 is a diagram of another particular illustrative embodiment of an apparatus to deposit a magnetic film.

Referring to FIG. 6, a diagram of another particular illustrative embodiment of an apparatus used to deposit a magnetic film is shown and generally designated 600. A deposition chamber 602 defines a space in which deposition of magnetic material can occur. A first set of electrical conducting coils 620 may produce a first magnetic field 608. A second set of conducting coils 622 may produce a second magnetic field 612. A third set of conducting coils 624 may produce a third magnetic field 614. Alternatively, each of the magnetic fields 608, 612, 614 may be produced by an alternate means that may include permanent magnets, or via another means of producing magnetic fields.

A device 615 may be a magnetic tunnel junction cell in a stage of fabrication. The device 615 includes rectangular walls. For example, a first wall 632 may have a first easy axis 630, a second wall 642 may have a second easy axis 640, and a third wall 652 may have a third easy axis 650. During deposition, the device 615 may be positioned so that the first easy axis 630 is oriented along the direction of the first magnetic field 608, the second easy axis 640 is oriented along the direction of the second magnetic field 612, and the third easy axis 652 is oriented along the direction of a third magnetic field 614. As a result of the presence of low intensity magnetic fields 608, 612 and 614, each magnetic particle, such as a magnetic particle 626, may become aligned with a resultant magnetic field 640 that is a vector sum of the magnetic fields 608, 612 and 614. Through the use of low intensity magnetic fields 608, 612, and 614, a deposited magnetic particle of a magnetic film may be at least partially aligned with a corresponding easy axis of a wall on which the magnetic particle is deposited.

Figure 7:
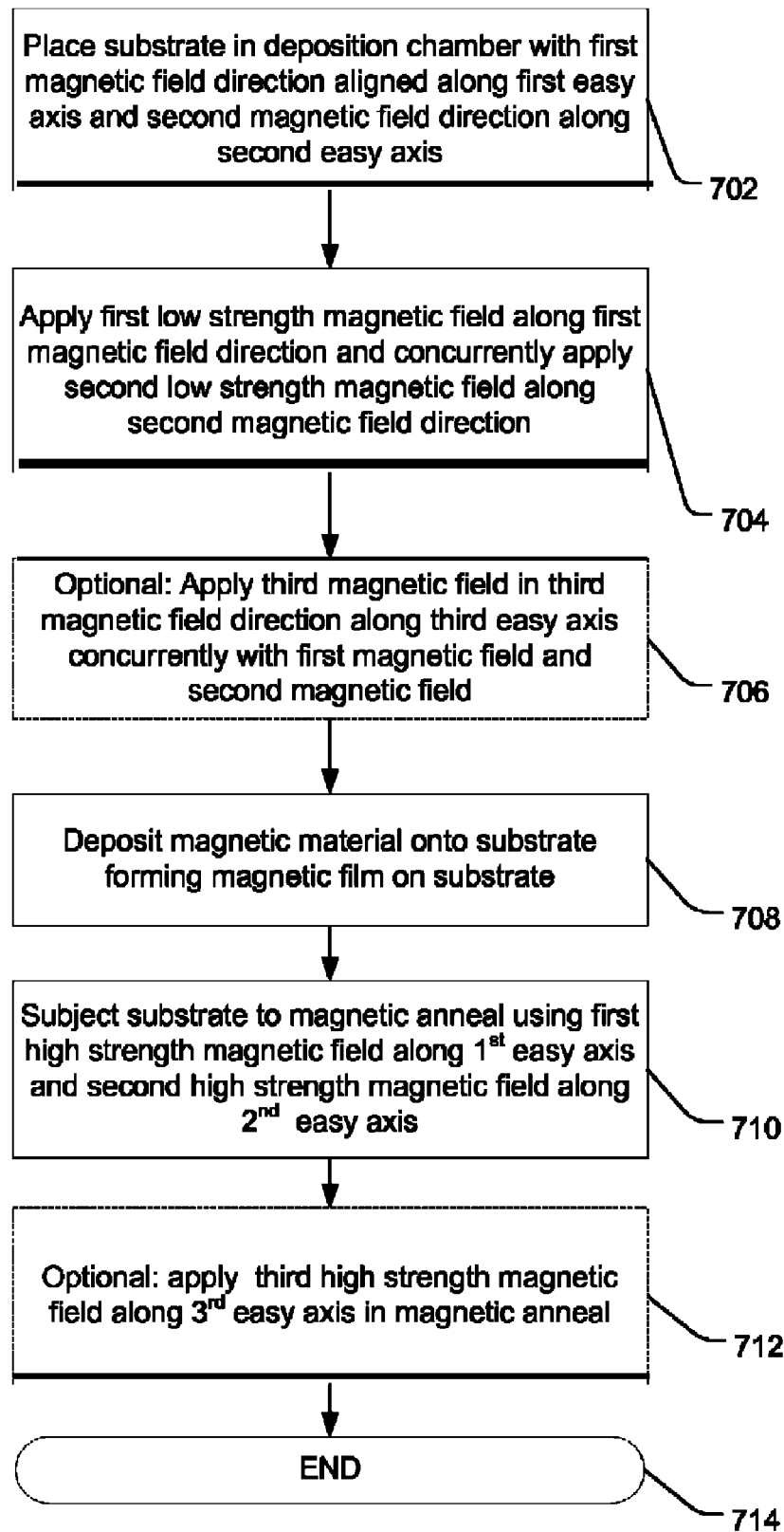
FIG. 7 is a flow diagram of a particular embodiment of a method of fabricating a magnetic random access memory.

Referring to FIG. 7, a flow diagram of a particular embodiment of a method of fabricating a magnetic random access memory (MRAM) is shown. At block 702, a substrate is placed in a deposition chamber with a first magnetic field direction aligned along a first easy axis of the substrate and a second magnetic field direction aligned along a second easy axis of the substrate. Moving to block 704, a first low strength magnetic field is applied along the first magnetic field direction within the deposition chamber and concurrently a second low strength magnetic field is applied along the second magnetic field direction within the deposition chamber. Moving to block 706, optionally a third magnetic field is applied along a third magnetic field direction with which a third easy axis of a portion of the substrate has been aligned. The third magnetic field is concurrently applied with the first magnetic field and the second magnetic field. Proceeding to block 708, magnetic material is deposited onto the substrate, forming a magnetic film on the substrate. Advancing to block 710, after deposition is complete, the substrate with the magnetic film deposited is subjected to magnetic annealing at an elevated temperature using a first high strength magnetic field applied along the first easy axis and a second high strength magnetic field concurrently applied along the second easy axis. Moving to block 712, optionally, a third high strength magnetic field may be applied concurrently along a third easy axis during magnetic annealing. The method terminates at block 714.

In operation, by applying a low strength magnetic field along a direction corresponding to an easy axis of a surface of a device during deposition of a magnetic film, the deposited magnetic film may be at least partially aligned with the easy axis. Especially for three dimensional MTJ structure, deposited magnetic film of each wall will be partially aligned with each easy axis. As a result of alignment of the magnetic film prior to magnetic annealing, the device, such as an MTJ cell, especially three dimensional MTJ, may demonstrate improved operating characteristics such as increased Tunnel Magnetoresistant Ratio (TMR). MTJs fabricated in this manner may operate with lower power consumption and higher MTJ cell density than MTJs fabricated by other methods.

A storage medium incorporating an MRAM fabricated as described herein may be coupled to a processor such that the processor can read information from, and write information to, the MRAM storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method of aligning a magnetic film, the method comprising:

applying a first magnetic field along a first direction in a region in which a substrate resides during a deposition of a first magnetic material onto the substrate, wherein the magnetic film comprises the first magnetic material; and applying a second magnetic field along a second direction in the region during the deposition of the first magnetic material onto the substrate wherein the substrate comprises a second magnetic material.

2. The method of claim 1, wherein the first magnetic field and the second magnetic field are applied at approximately the same time.

3. The method of claim 2, wherein the first magnetic field and the second magnetic field are applied during a common time interval.

4. The method of claim 1, wherein the first magnetic field is oriented approximately parallel to a first easy axis of a first portion of the substrate and the second magnetic field is oriented approximately parallel to a second easy axis of a second portion of the substrate.

5. The method of claim 1, wherein the first magnetic field has a first magnetic field strength, wherein the first magnetic field strength has a value of less than approximately 1000 Oersted.

6. The method of claim 1, wherein the second magnetic field has a second magnetic field strength, wherein the second magnetic field strength has a value of less than approximately 1000 Oersted.

7. The method of claim 1, further comprising, after the deposition of the first magnetic material, magnetically annealing the first magnetic material, wherein the magnetic annealing comprises applying a third magnetic field to the region, the third magnetic field oriented substantially along the first direction.

8. The method of claim 7, wherein the third magnetic field has a third magnetic field strength that exceeds a first magnetic field strength associated with the first magnetic field.

9. The method of claim 7, further comprising applying a fourth magnetic field to the region, wherein the fourth magnetic field is oriented substantially along the second direction.

10. The method of claim 9, wherein the fourth magnetic field has a fourth magnetic field strength that exceeds a second magnetic field strength associated with the second magnetic field.

11. The method of claim 1, wherein the substrate comprises:
a first substrate portion having a first easy axis and a second substrate portion having a second easy axis;
wherein the substrate is oriented within the region so that the first easy axis is oriented substantially along the first direction and the second easy axis is oriented substantially along the second direction.

12. An apparatus comprising:
a deposition chamber configured to deposit a magnetic material onto a substrate, the deposition chamber including a deposition region;
means for applying a first magnetic field within the deposition region, the first magnetic field oriented substantially along a first direction;
means for applying a second magnetic field within the deposition region, the second magnetic field oriented substantially along a second direction;
wherein the magnetic material is within the deposition region during a deposition process; and
means for applying a third magnetic field within the first region, the third magnetic field oriented substantially along a third direction that differs from the first direction and the second direction.

13. The apparatus of claim 12, wherein the first magnetic field has a first magnetic field strength that does not exceed a few hundred Oersted.

14. The apparatus of claim 12, wherein the first magnetic field has a first magnetic field strength that does not exceed approximately 100 Oersted.

15. The apparatus of claim 12, wherein the second magnetic field has a second magnetic field strength that does not exceed a few hundred Oersted.

16. The apparatus of claim 12, wherein the second magnetic field has a second magnetic field strength that does not exceed one hundred Oersted.

17. The apparatus of claim 12, wherein the first direction is approximately perpendicular to the second direction.

18. The apparatus of claim 12, wherein the substrate comprises:
a first substrate portion having a first easy axis, a second substrate portion having a second easy axis, and a third substrate portion having a third easy axis;
wherein the first easy axis is oriented substantially along the first direction, the second easy axis is oriented substantially along the second direction, and the third easy axis is oriented substantially along the third direction.

19. An apparatus comprising:
a housing defining an enclosure configured to enclose a substrate including a first substrate portion having a first easy axis and a second substrate portion having a second easy axis, the substrate to receive a magnetic material via deposition while the substrate is in the enclosure;
a first magnetic field generator configured to generate a first magnetic field in the enclosure, the first magnetic field having a first magnetic field direction;
a second magnetic field generator configured to generate a second magnetic field in the enclosure, the second magnetic field having a second magnetic field direction;
wherein when the first magnetic field direction substantially coincides with the first easy axis a first portion of the deposited magnetic material residing on the first substrate portion has a first magnetic orientation that is at least partially aligned with the first easy axis; and
wherein when the second magnetic field substantially coincides with the second easy axis a second portion of the deposited magnetic material residing on the second substrate portion has a second magnetic orientation that is at least partially aligned with the second easy axis.

20. The apparatus of claim 18, wherein the first portion of the deposited magnetic material and the second portion of the deposited magnetic material form a magnetic film at least partially covering the substrate.

21. The apparatus of claim 19, wherein a magnetic tunnel junction is formed from a portion of the substrate and a portion of the magnetic film.

22. A magnetic random access memory (MRAM) comprising:
a substrate including a first substrate portion having a first easy axis and a second substrate portion having a second easy axis;
a film including magnetic material deposited on the substrate, the film including a first film portion and a second film portion;
the first film portion coupled to the first substrate portion, wherein the first film portion includes a first magnetic material portion that is aligned substantially along the first easy axis;
the second film portion coupled to the second substrate portion, wherein the second film portion includes a second magnetic material portion that is substantially aligned along the second easy axis;
wherein during deposition of the film, the substrate is subjected to a first magnetic field that is oriented substantially along the first easy axis while the substrate is subjected to a second magnetic field that is oriented substantially along the second easy axis.

23. The MRAM of claim 22, wherein the first magnetic field has a first magnetic field strength that is less than a few hundred Oersted and the second magnetic field has a second magnetic field strength that is less than a few hundred Oersted.

24. The MRAM of claim 22, wherein the MRAM is coupled to a processor.

25. The MRAM of claim 24, wherein the processor is disposed in an application specific integrated circuit.

26. The MRAM of claim 22, wherein the MRAM is disposed in a wireless device.

27. The MRAM of claim 22, wherein the MRAM is disposed in a personal digital assistant.

28. The MRAM of claim 22, wherein the MRAM is disposed in a paging device.

29. A method of aligning a magnetic film comprising:
a first step for applying a first magnetic field along a first direction in a region in which a substrate resides during deposition of a first magnetic material onto the substrate, wherein the magnetic film comprises the first magnetic material; and
a second step for applying a second magnetic field along a second direction in the region during the deposition of the first magnetic material onto the substrate, wherein the substrate comprises a second magnetic material.

30. The method of claim 29, wherein the first magnetic field and the second magnetic field are applied during a common time interval.

31. A method of aligning a magnetic film, the method comprising:
applying a first magnetic field along a first direction in a region in which a substrate resides during a deposition of a first magnetic material onto the substrate, wherein the magnetic film comprises the first magnetic material; and
applying a second magnetic field along a second direction in the region during the deposition of the first magnetic material onto the substrate, wherein the first magnetic field is oriented substantially parallel to a first easy axis of a first portion of the substrate and the second magnetic field is oriented substantially parallel to a second easy axis of a second portion of the substrate.

32. The method of claim 31, wherein the first magnetic field and the second magnetic field are applied during a common time interval.

33. A method of aligning a magnetic film, the method comprising:
applying a first magnetic field along a first direction in a region in which a substrate resides during deposition of a first magnetic material onto the substrate, wherein the magnetic film comprises the first magnetic material;
applying a second magnetic field along a second direction in the region during the deposition of the first magnetic material onto the substrate; and
after the deposition of the first magnetic material, magnetically annealing the first magnetic material, wherein the magnetic annealing comprises applying a third magnetic field to the region, the third magnetic field oriented substantially along the first direction.

34. The method of claim 33, wherein the third magnetic field has a third magnetic field strength that exceeds a first magnetic field strength associated with the first magnetic field.

35. A method of aligning a magnetic film, the method comprising:
applying a first magnetic field along a first direction in a region in which a substrate resides during deposition of a first magnetic material onto the substrate, wherein the magnetic film comprises the first magnetic material; and
applying a second magnetic field along a second direction in the region during the deposition of the first magnetic material onto the substrate, wherein the substrate comprises a first substrate portion having a first easy axis and a second substrate portion having a second easy axis, and wherein the substrate is oriented within the region so that the first easy axis is oriented substantially along the first direction and the second easy axis is oriented substantially along the second direction.

36. The method of claim 35, wherein the first magnetic field is oriented substantially parallel to the first easy axis of the first substrate portion and the second magnetic field is oriented substantially parallel to the second easy axis of the second substrate portion.

37. An apparatus comprising:
a deposition chamber configured to deposit a magnetic material onto a substrate, the deposition chamber including a deposition region, wherein the substrate comprises:
a first substrate portion having a first easy axis, a second substrate portion having a second easy axis, and a third substrate portion having a third easy axis;
wherein the first easy axis is oriented substantially along a first direction, the second easy axis is oriented substantially along a second direction, and the third easy axis is oriented substantially along a third direction;
means for applying a first magnetic field within the deposition region, the first magnetic field oriented substantially along the first direction; and
means for applying a second magnetic field within the deposition region, the second magnetic field oriented substantially along the second direction;
wherein the magnetic material is within the deposition region during a deposition process.

38. The apparatus of claim 37, wherein the magnetic material is subjected to the first magnetic field and the second magnetic field during a common time interval.

* * * * *